US011355415B2

(12) United States Patent
Oohiraki et al.

(10) Patent No.: US 11,355,415 B2
(45) Date of Patent: Jun. 7, 2022

(54) HEAT SINK-ATTACHED POWER MODULE SUBSTRATE BOARD AND POWER MODULE

(71) Applicant: MITSUBISHI MATERIALS CORPORATION, Tokyo (JP)

(72) Inventors: Tomoya Oohiraki, Saitama (JP); Sotaro Oi, Saitama (JP)

(73) Assignee: MITSUBISHI MATERIALS CORPORATION, Tokyo (JP)

(*) Notice: Subject to any disclaimer, the term of this patent is extended or adjusted under 35 U.S.C. 154(b) by 149 days.

(21) Appl. No.: 16/963,667

(22) PCT Filed: Jan. 23, 2019

(86) PCT No.: PCT/JP2019/002076
§ 371 (c)(1),
(2) Date: Jul. 21, 2020

(87) PCT Pub. No.: WO2019/146640
PCT Pub. Date: Aug. 1, 2019

(65) Prior Publication Data
US 2021/0074607 A1 Mar. 11, 2021

(30) Foreign Application Priority Data
Jan. 24, 2018 (JP) .............................. JP2018-009313

(51) Int. Cl.
*H01L 23/373* (2006.01)
*H01L 23/367* (2006.01)
(Continued)

(52) U.S. Cl.
CPC ........ *H01L 23/3735* (2013.01); *H01L 23/367* (2013.01); *H01L 23/3677* (2013.01); *H01L 25/072* (2013.01); *H01L 25/18* (2013.01)

(58) Field of Classification Search
CPC ............... H01L 23/15; H01L 23/367; H01L 23/3677; H01L 23/3735; H01L 23/3736; H01L 23/4334
See application file for complete search history.

(56) References Cited

U.S. PATENT DOCUMENTS 9,723,707 B2   8/2017  Terasaki et al.
9,807,865 B2  10/2017  Nagatomo et al.
(Continued)

FOREIGN PATENT DOCUMENTS

JP  2003-078086 A   3/2003
JP  2015-211125 A  11/2015
(Continued)

OTHER PUBLICATIONS

International Search Report dated Apr. 9, 2019, issued for PCT/JP2019/002076.

*Primary Examiner* — Allan R Wilson
(74) *Attorney, Agent, or Firm* — Locke Lord LLP

(57) ABSTRACT

A heat sink-attached power module substrate board has a ratio $(A1 \times t1 \times \sigma1 \times \alpha1)/\{(A2 \times t2 \times \sigma2 \times \alpha2)+(A3 \times t3 \times \sigma3 \times \alpha3)\}$ at 25° C. is not less than 0.70 and not more than 1.30, where A1 (mm$^2$) is a bonding area of a second layer and a first layer composing a circuit layer; t1 (mm) is an equivalent board thickness, $\sigma1$ (N/mm$^2$) is yield strength, and $\alpha1$ (/K) is a linear expansion coefficient, all of the second layer, where A2 (mm$^2$) is a bonding area of the heat radiation-side bonding material and the metal layer; t2 (mm) is equivalent board thickness, $\sigma2$ (N/mm$^2$) is yield strength, and $\alpha2$ (/K) is a linear expansion coefficient, all of the heat radiation-side bonding material, and where A3 (mm$^2$) is a bonding area of the heat sink and the heat radiation-side bonding material; t3 (mm) is equivalent board thickness, $\sigma3$ (N/mm$^2$) is yield strength, and $\alpha3$ (/K) is a linear expansion coefficient, all of the heat sink.

6 Claims, 10 Drawing Sheets

(51) Int. Cl.
    *H01L 25/07*      (2006.01)
    *H01L 25/18*      (2006.01)

(56)          References Cited

U.S. PATENT DOCUMENTS

2016/0021729 A1*  1/2016  Nagatomo ........... B23K 1/0016
                                                      174/257
2016/0035660 A1*  2/2016  Terasaki ............ H01L 23/49838
                                                      174/257
2017/0047268 A1   2/2017  Terasaki et al.
2017/0053852 A1   2/2017  Oi et al.
2017/0154855 A1   6/2017  Oi et al.
2018/0301391 A1  10/2018  Oohiraki et al.

FOREIGN PATENT DOCUMENTS

JP         2015-216370 A    12/2015
JP          2016-27645 A     2/2016
JP          2016-46356 A     4/2016
JP         2016-181549 A    10/2016
JP          2017-73483 A     4/2017

* cited by examiner

HEAT SINK-ATTACHED POWER MODULE SUBSTRATE BOARD AND POWER MODULE

BACKGROUND OF THE INVENTION

Technical Field

The present invention relates to a heat sink-attached power module substrate board and a power module used for a semiconductor device controlling large current and high voltage. The Priority is claimed on Japanese Patent Application No. 2018-009313, filed Jan. 24, 2018, the content of which is incorporated herein by reference.

Background Art

As a power module substrate board used for a power module, for example, known is a structure having a ceramic substrate board such as AlN (aluminum nitride), $Al_2O_4$ (alumina), $Si_3N_4$ (silicon nitride), or the like and a circuit layer bonded on one surface of the ceramic substrate board made of metal having excellent electric conductivity such as aluminum (Al), copper (Cu), and the like.

In the power module substrates board of this kind, there are cases in which a metal layer having high heat conductivity is formed on the other surface of the ceramic substrate board, and a heat sink (a heat-radiation layer) is bonded with the metal layer. The heat sink-attached power module substrate board on which the heat sink is joined is used in a state in which the heat sink is fixed on a cooler.

A power module is manufactured by loading (mounting) semiconductor elements such as power elements on a surface (a top surface) of the circuit layer of the heat sink-attached power module substrate board composed as above described. The power module in which the semiconductor elements are mounted may be sealed with resin by potting, molding, or the like in order to maintain electric insulation, protect wires, and the like.

A heat sink-attached power module substrate board is generally manufactured by joining a heat sink having high rigidity on a metal layer; and a circuit layer joined on one surface and the metal layer joined on the other surface of the ceramic substrate board are formed to have substantially a same thickness. Therefore, the heat sink-attached power module substrate has a difference of the rigidity at the upper and the lower with the ceramic substrate board therebetween; and a warp may be generated when it is heated in a mounting step of the semiconductors, or by temperature variation in usage environment, or the like.

If the warp is generated in the mounting step, bonding reliability is deteriorated on account of shifting of position of the semiconductor elements, distortion or cracks generated in joined parts of the semiconductor elements. In a case in which the warp is generated in the usage environment, because of an outflow of thermal conductive grease between the heat sink and the cooler by pumping out from between the heat sink and the cooler, adhesiveness of the heat sink and the cooler is deteriorated, and thermal resistance is increased, so that thermal radiation property is hindered.

For this reason, it is required that the warp is small in the heat sink-attached power module substrate board: technology of reducing the warp of the heat sink-attached power module substrate board is proposed in the past.

For example, in Patent Document 1, it is described to compose a symmetric structure centering a ceramic substrate board with a heat sink made of aluminum having high rigidity, by forming a circuit layer as a laminated structure of a first layer and a second layer and disposing the second layer made of aluminum having the high rigidity on the opposed surface of the ceramic substrate board.

Patent Document 1 also describes that the second layer of the circuit layer and the heat sink are set to satisfy a range of a ratio $(t1 \times A1 \times \sigma1)/(t2 \times A2 \times \sigma2)$ to be in not less than 0.85 and not more than 1.40, where the second layer of the circuit layer and the heat sink have thicknesses t1 and t2 (mm), joined areas A1 and A2 ($mm^2$), and yield strengths $\sigma1$ and $\sigma2$ ($N/mm^2$), so that the warp can be prevented by improving the symmetry centering the ceramic substrate board.

Patent Document 2 describes that in a circuit layer composed of a plurality of small-circuit layers, the small-circuit layers have a structure of laminating a first layer and a second layer; and a heat sink (a heat radiation board) and the second layer are formed from material (copper or aluminum) of a same main ingredient, so that a symmetric structure centering a ceramic substrate board is composed.

Patent document 2 describes that the symmetry of the circuit layer and the metal layer is further improved by providing non-joined part of the metal layer to the ceramic substrate board in non-joined area of the small-circuit layers.

CITATION LIST

Patent Document 1: Japanese Unexamined Patent Application, First Publication No. 2015-216370
Patent Document 2: Japanese Unexamined Patent Application, First Publication No. 2017-73483

BRIEF SUMMARY OF THE INVENTION

Technical Problem

As described above, in order to reduce the warp in the heat sink-attached power module substrate board while being heated, composing the symmetry structure centering the ceramic substrate board is carried out. However, in Patent Document 1 and Patent Document 2, the symmetry structure centering the ceramic substrate board is composed by forming the heat sink (the heat radiation board) and the second layer of the circuit layer from material (copper or aluminum) of the same main ingredient: it is not possible to apply in a case of forming the circuit layer (the second layer) and the heat sink from different materials.

The present invention is achieved in consideration of the above circumstances, and has an object to provide a heat sink-attached power module substrate board and a power module in which the circuit layer and the heat sink can be made of different materials, and the warp while being heated can be reduced.

Solution to Problem

A heat sink-attached power module substrate board of the present invention is provided with a ceramic substrate board; a circuit layer joined on a first surface of the ceramic substrate board; a metal layer joined on a second surface of the ceramic substrate board; and a heat sink joined on the metal layer with heat radiation-side bonding material therebetween: in the heat sink-attached power module substrate board, the circuit layer is a laminated structure having a first layer joined on the first surface of the ceramic substrate board and a second layer joined on a surface of the first layer; the first layer and the metal layer are made of aluminum with purity of not less than 99.99% by mass, the second layer and the heat radiation-side bonding material are made of pure copper or copper alloy, the heat sink is made of aluminum of lower purity than the first layer and the metal layer, where A1 (mm$^2$) is a bonding area of the second layer and the first layer, t1 (mm) is an equivalent board thickness dividing a volume of the second layer by the bonding area A1, σ1 (N/mm$^2$) is an yield strength of the second layer, and α1 (/K) is a linear expansion coefficient of the second layer; where A2 (mm$^2$) is a bonding area of the heat radiation-side bonding material and the metal layer, t2 (mm) is an equivalent board thickness dividing a volume of the heat radiation-side bonding material by the bonding area A2, σ2 (N/mm$^2$) is an yield strength of the heat radiation-side bonding material, and α2 (/K) is a linear expansion coefficient of the heat radiation-side bonding material; and where A3 (mm$^2$) is a bonding area of the heat sink and the heat radiation-side bonding material, t3 (mm) is an equivalent board thickness dividing a volume of the heat sink by the bonding area A3, σ3 (N/mm$^2$) is an yield strength of the heat sink, and α3 (/K) is a linear expansion coefficient of the heat sink, a ratio (A1×t1×σ1×α1)/{(A2×t2×σ2×α2)+(A3×t3×σ3×α3)} at 25° C. is not less than 0.70 and not more than 1.30.

In this heat sink-attached power module substrate board, the circuit layer is the laminated structure of the first layer and the second layer, copper material is used for the second layer of the circuit layer, aluminum material is used for the heat sink, and the second layer is composed of copper having higher electric conductivity than aluminum. By using the aluminum material with low purity of aluminum and high rigidity, i.e., high yield strength for the heat sink and using the copper material for the heat radiation-side bonding material between the metal layer and the heat sink, and by adjusting the above-mentioned ratio at 25° C. in the above-mentioned range in the combination, the symmetry structure centering the ceramic substrate board is composed.

Any of the bonding areas A1, A2, and A3, the equivalent board thicknesses t1, t2, and t3, the yield strengths σ1, σ2, and σ3 and the linear expansion coefficients α1, α2, and α3 are values at 25° C. (normal temperature).

In the heat sink-attached power module substrate board, forms of the circuit layer and the heat sink are composed by various variations in a case in which the circuit layer is patterned by arranging a plurality of small-circuit layers and a case in which a fin is disposed on the heat sink. Also in those case, by evaluating the rigidity of the members by not only the yield strengths but a relational expression including the equivalent board thickness which is the volume of the members divided by the bonding area and the linear expansion coefficient of the members, the symmetry structure can be stably composed in the heat sink-attached power module substrate board having various forms for the symmetry of the rigidity and thermal stress between the second layer and the heat sink and the heat radiation-side bonding material, so that the warp can be reliably prevented.

Furthermore, arranged as the first layer or the metal layer bonded on the ceramic substrate board is the aluminum board with purity not less than 99.99% which is relatively soft: in other words, the yield strength is low; accordingly, it is possible to reduce the thermal stress on the ceramic substrate board while the heat sink-attached power module substrate board being heated, so that breakages can be prevented.

Therefore, the stress generated at both surfaces of the ceramic substrate board while the heat sink-attached power module substrate board is heated is not easily biased, and the warp in the mounting step of the semiconductor elements and under the usage environment can be prevented from occurring. Accordingly, the bonding reliability of the power module can be improved, and good heat radiation property can be shown.

As a preferable embodiment of the heat sink-attached power module substrate board of the present invention, it is good that an area of a top surface part of the heat sink on which the heat radiation-side bonding material is bonded be larger than an area of a bonded surface with the heat radiation-side bonding material.

By forming the top surface part of the heat sink to have the larger area than the bonded surface with the heat radiation-side bonding material, it is possible to provide a large bonding area to molding resin when the power module on which the semiconductor elements are mounted is sealed with the molding resin and the like. Accordingly, it is possible to improve the bonding reliability of the semiconductor elements and the heat sink-attached power module substrate board.

As a preferable embodiment of the heat sink-attached power module substrate board of the present invention, it is desirable that the heat sink have a peripheral wall part standing at periphery of the top surface part toward the circuit layer and at least a part of the heat radiation-side bonding material be settled in a storing concave part surrounded by the top surface part and the peripheral wall part.

By forming the storing concave part surrounded by the peripheral wall part on the heat sink, when the power module on which the semiconductor elements are mounted is sealed by the molding resin and the like, it is possible to provide the still more larger bonding area to the molding resin, and it is possible to improve the bonding reliability of the semiconductor elements and the heat sink-attached power module substrate board.

A power module of the present invention is provided with the heat sink-attached power module substrate board and a semiconductor element mounted on a surface of the circuit layer.

Advantageous Effects of Invention

According to the present invention, in the heat sink-attached power module substrate board in which the circuit layer and the heat sink are formed of the different material, the warp while being heated can be reduced, so that defects of the mounting step of the semiconductor elements can be removed, the warp while heat cycles (hot-cold cycles), and the bonding reliability can be improved.

DESCRIPTION OF EMBODIMENTS

Below, embodiments of the present invention will be explained referring drawings.

First Embodiment

Figure 1:
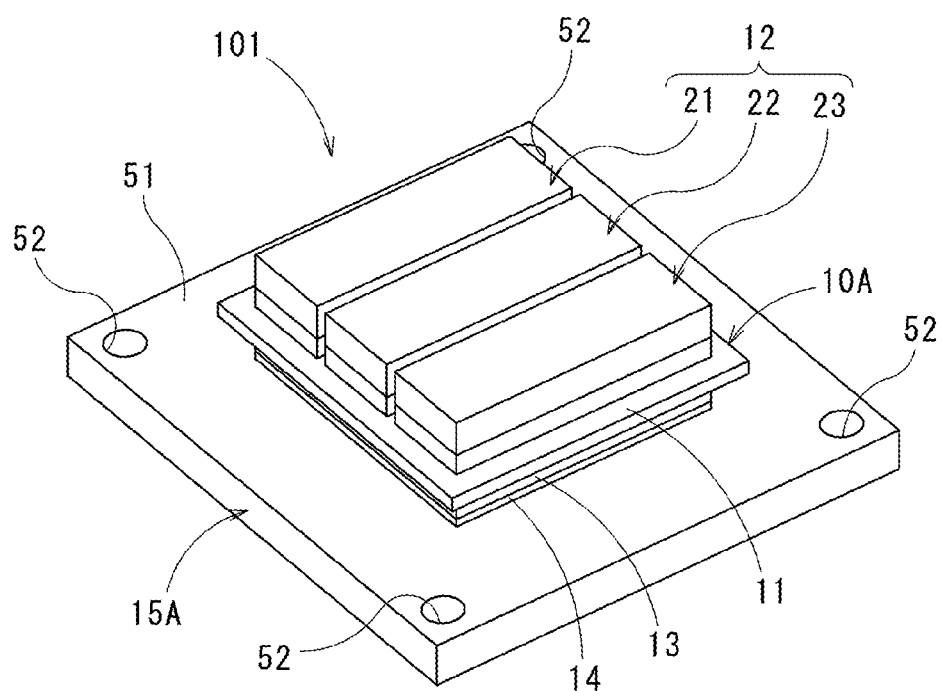
FIG. 1 It is a perspective view of a heat sink-attached power module substrate board of a first embodiment of the present invention.
Figure 2:
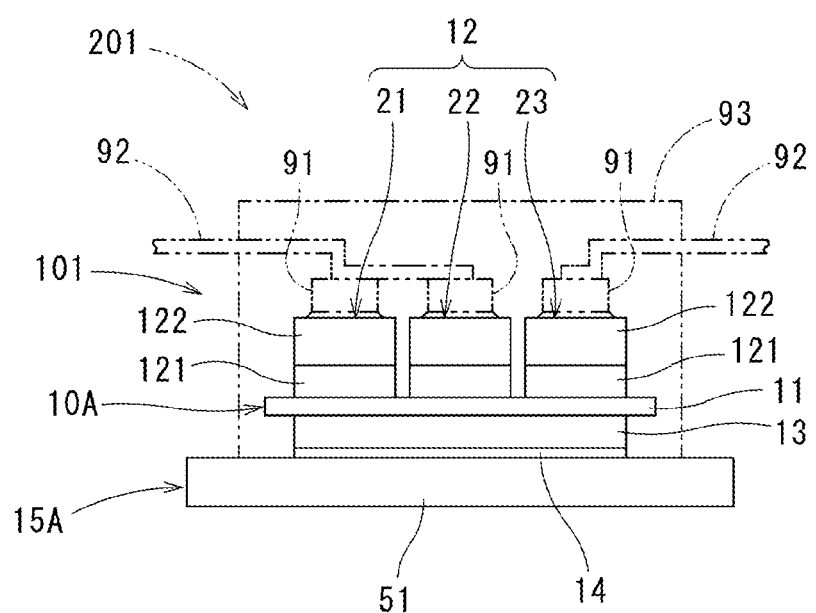
FIG. 2 It is a front view of the heat sink-attached power module substrate board shown in FIG. 1.

FIG. 1 and FIG. 2 show a heat sink-attached power module substrate board 101 of a first embodiment. The heat sink-attached power module substrate board 101 is provided with a power module substrate board 10A and a heat sink 15A bonded on the power module substrate board 10A with a heat radiation-side bonding material 14 therebetween.

A power module 201 is manufactured by mounting elements 91 such as semiconductor elements and the like on a surface of the heat sink-attached power module substrate board 101 as shown in FIG. 2. The elements 91 and the heat sink-attached power module substrate board 101 are resin-shielded by molding resin 93 consisting of epoxy resin or the like, and the power module 201 is used in a state of being fixed by pressing an exposed surface of the power module 201 (an exposed surface of the heat sink 15A) of the power module 201 against a surface of another member such as a cooler or the like.

The power module substrate board 10A is provided with one ceramic substrate board 11, a circuit layer 12 joined on a first surface of the ceramic substrate board 11, and one metal layer 13 joined on a second surface of the ceramic substrate board 11 as shown in FIG. 1 and FIG. 2.

The ceramic substrate board 11 is made of ceramic material such as MN (aluminum nitride), $Si_3N_4$ (silicon nitride), $Al_2O_3$ (alumina) or the like, for example.

The circuit layer 12 consists of a plurality of small-circuit layers 21 to 23 as shown in FIG. 1 and FIG. 2. The small-circuit layers 21 to 23 are joined on the first surface of the ceramic substrate board 11 with an interval therebetween. The small-circuit layers 21 to 23 composing the circuit layer 12 have a laminated structure having first layers 121 joined on a surface (the first surface) of the ceramic substrate board 11 and second layers 122 joined on a surface of the circuit layer 121 (an opposed surface to the ceramic substrate board 11).

The first layers 121 are formed of aluminum of purity not less than 99.99% by mass (so-called 4N aluminum) and joined on the first surface of the ceramic substrate board 11 by brazing material. The second layers 122 are formed of pure copper or copper alloy and joined on the first layers 121 made of aluminum by solid phase diffusion bonding.

The metal layer 13 is formed of aluminum with purity of not less than 99.99% by mass same as the first layers 121 of the circuit layer 12 and joined on the second surface (an opposed side of the circuit layer 12) of the ceramic substrate board 11 by brazing material.

The heat sink 15A is joined on the surface (the opposed surface to the ceramic substrate board 11) of the metal layer 13 with the heat radiation-side bonding material 14 therebetween. The heat radiation-side bonding material 14 is made of copper or copper alloy same as the second layers 122 of the circuit layer 12 and joined to the metal layer 13 and the heat sink 15A by solid phase diffusion bonding.

The heat sink 15A is formed of aluminum with lower purity than the first layers 121 of the circuit layer 12 and the metal layer 13; for example by JIS standard, it is formed of so-called 3N aluminum with purity of not less than 99.90% by mass, so-called 2N aluminum with purity of not less than 99.0% by mass (e.g., A1050 and so forth), and aluminum alloys such as A3003, A6063, A5052, and the like.

In FIG. 1 and FIG. 2, the heat sink 15A has a top surface part 51 of a rectangle flat board shape. The heat radiation-side bonding material 14 is joined on the top surface part 51. The metal layer 13 of the power module substrate board 10A is joined on the top surface part 51 with the heat radiation-side bonding material 14 therebetween. An upper surface of the top surface part 51 is formed to be larger than a bonded surface to the heat radiation-side bonding material 14. Mounting holes 52 penetrating in a thickness direction are formed at four corners in a surface direction of the top surface part. It is possible to assemble the heat sink-attached power module substrate board 101 into another member using the mounting holes 52 of the heat sink 15A by screwing and so forth.

A form of the heat sink 15A is not especially limited, but other than a flat board form shown in FIG. 1 and FIG. 2, suitable forms such as a form in which a plurality of pin fins are integrally formed, a form in which belt fins which are parallel to each other are integrally formed, and the like are applicable.

An example of dimensions of the heat sink-attached power module substrate board 101 composed as above is as follows: a board thickness of the ceramic substrate board 11 made of $Si_3N_4$ (silicon nitride) is 0.2 mm to 1.5 mm; a board thickness of the first layers 121 made of aluminum with purity of not less than 99.99% by mass (so-called 4N aluminum) is 0.1 mm to 2.5 mm; and a board thickness of the metal layer 13 is 0.1 mm to 2.5 mm. A board thickness of the second layer 122 made of oxygen-free copper (C1020) is 0.1 mm to 4.0 mm; and a board thickness of the heat radiation-side bonding material 14 is 0.05 mm to 2.0 mm. A board thickness of the top surface part 51 of the heat sink 15A made of A6063 aluminum alloy is 0.5 mm to 3.0 mm. However, these dimensions are not limited to the above value ranges.

The heat sink-attached power module substrate board 101 composed as above is adjusted to be a relation in which a ratio $(A1 \times t1 \times \sigma1 \times \alpha1)/\{(A2 \times t2 \times \sigma2 \times \alpha2)+(A3 \times t3 \times \sigma3 \times \alpha3)\}$ at 25° C. (room temperature) is not less than 0.70 and not more than 1.30; where A1 (mm$^2$) is a bonding area of the second layers 122 and the first layers 121 in the circuit layer 12, t1 (mm) is an equivalent board thickness dividing a volume of the second layers by the bonding area A1, σ1 (N/mm$^2$) is an yield strength of the second layers 122, and α1 (/K) is a linear expansion coefficient of the second layers 122;

where A2 (mm$^2$) is a bonding area of the heat radiation-side bonding material 14 and the metal layer 13, t2 (mm) is an equivalent board thickness dividing a volume of the heat radiation-side bonding material 14 by the bonding area A2, σ2 (N/mm$^2$) is an yield strength of the heat radiation-side bonding material 14, and α2 (/K) is a linear expansion coefficient of the heat radiation-side bonding material 14; and where A3 (mm$^2$) is a bonding area of the heat sink 15A and the heat radiation-side bonding material 14, t3 (mm) is an equivalent board thickness dividing a volume of the heat sink 15A by the bonding area A3, σ3 (N/mm²) is an yield strength of the heat sink 15A, and α3 (/K) is a linear expansion coefficient of the heat sink 15A.

The bonding areas A1, A2, and A3, the equivalent board thicknesses t1, t2, and t3, the yield stresses σ1, σ2, and σ3, and the linear expansion coefficients α1, α2, and α3 are the values at 25° C. (normal temperature).

Figure 4:
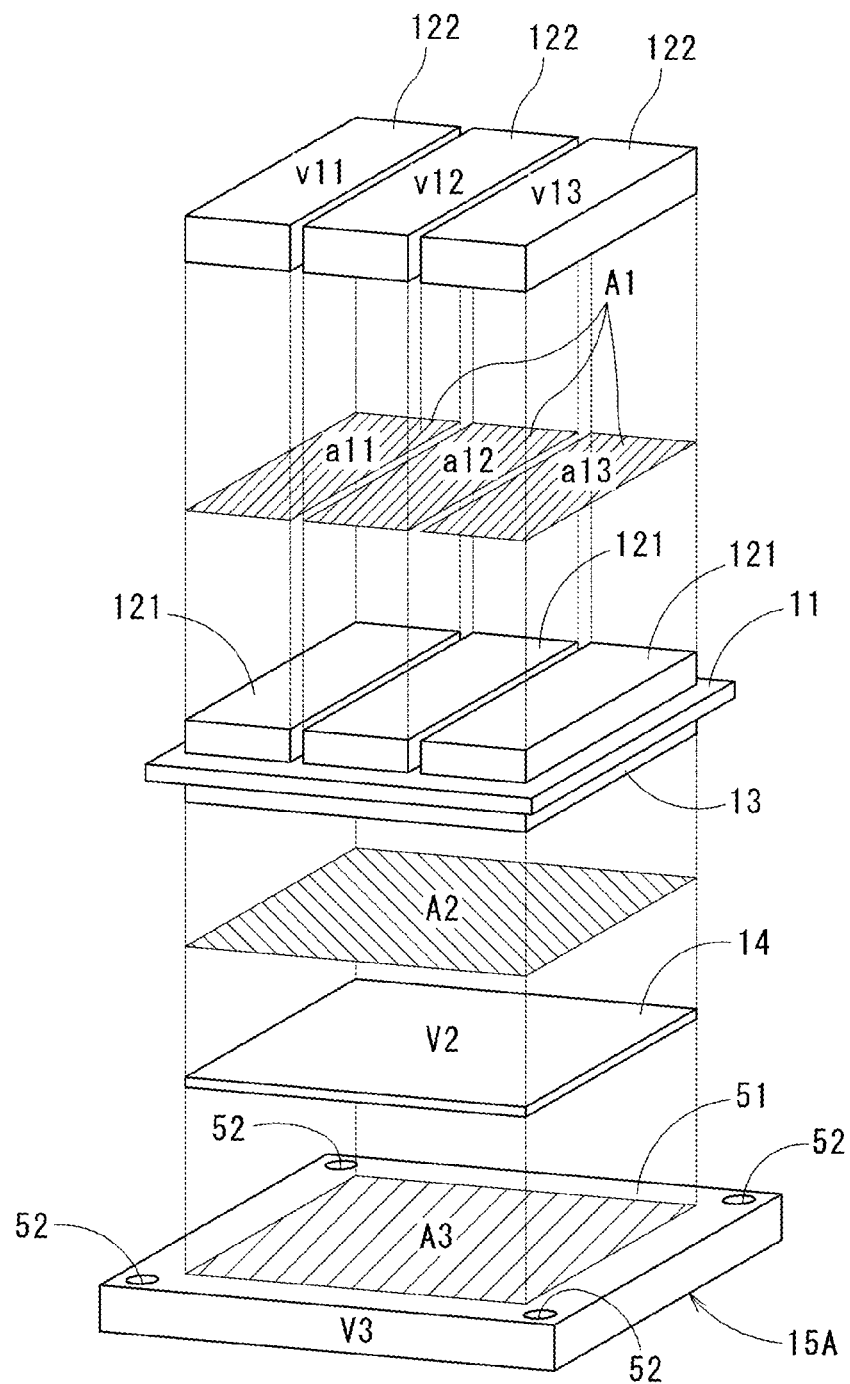
FIG. 4 It is a schematic view explaining a bonding area of the members.

In this embodiment, the bonding area A1 of the first layers 121 and the second layers 122 in the relational expression of the above ratio is a total sum (a11+a12+a13) of bonding areas a11 to a13 of the three first layers 121 and the three second layers 122 in the small-circuit layers 21 to 23 composing the circuit layer 12, since the circuit layer 12 is formed from the plurality of small-circuit layers 21 to 23, as shown in FIG. 4. The equivalent board thickness t1 of the second layer 122 is a value of a total volume V1 of the three second layers 122 divided by the bonding area A1 in the small-circuit layers 21 to 23.

For example, as shown in FIG. 4, where volumes of the second layers 122 in the respective small-circuit layers 21 to 23 are v11, v12, and v13, a total volume V1=(v11+v12+v13) of the second layers 122, and the equivalent board thickness t1 of the second layers 122 is (V1/A1)={(v11+v12+v13)/(a11+a12+a13)}.

In this embodiment, since the heat radiation-side bonding material 14 is composed of one as shown in FIG. 4, a volume V2 of the heat radiation-side bonding material 14 is single volume and the bonding area A2 of the heat radiation-side bonding material 14 and the metal layer 13 is single area. Accordingly, the equivalent board thickness t2 of the heat radiation-side bonding material 14 is (V2/A2).

The heat sink 15A is composed of the top surface part 51 which is single rectangular flat board shape; the upper surface of the top surface part 51 has the larger area than the bonded surface (the part indicated by the bonding area A3) to the heat radiation-side bonding material 14 as shown in FIG. 4. Consequently, the equivalent board thickness t3=(V3/A3), dividing a volume V3 of the heat sink 15A by the bonding area A3, is larger than a real board thickness of the heat sink 15A. The mounting holes 52 are formed in the top surface part 51, so that a space volume of the mounting holes 52 is not included in the volume V3 of the heat sink 15A.

For example, in a case in which the second layers 122 of the respective small-circuit layers 21 to 23 are formed into the same shape of a rectangle board (11 mm×36 mm×1.0 mm) made of C1020 (oxygen-free copper, the yield strength σ1=195 N/mm², the linear expansion coefficient α1=16.8/K), the areas a11 to a13 are (11 mm×36 mm) and the volumes v11 to v13 are (11 mm×36 mm×1.0 mm) respectively, and the total area A1=3×(11 mm×36 mm), the total volume V1=3×(11 mm×36 mm×1.0 mm), and the equivalent board thickness t1=1.0 mm.

In a case in which the heat radiation-side bonding material 14 is formed into a rectangle board shape (36 mm×36 mm×0.1 mm) made of the same material (C1020, the yield strength σ2=195 N/mm², the linear expansion coefficient α2=16.8/K) as the second layers 122, the bonding area A2=(36 mm×36 mm), the volume V2=(36 mm×36 mm×0.1 mm), and the equivalent board thickness t2=0.1 mm.

If the heat sink 15A is aluminum alloy, the yield strength σ3=50 N/mm² and the linear expansion coefficient α3=23.4/K at 25° C. In a case in which the top surface part 51 of the heat sink 15A is formed as a rectangle flat board (50 mm×50 mm×1.0 mm) and the mounting holes 52 (a diameter 4.0 mm×αdepth 1.0 mm) is formed on the four corners of the top surface part 51, the volume V3={(50 mm×50 mm×1.0 mm)−4×(π)×(2.0 mm)²×1.0 mm}.

In a case in which the bonding area A3 of the heat sink 15A and the heat radiation-side bonding material 14 is the same size (36 mm×36 mm) as the bonding area A2 of the heat radiation-side bonding material 14 and the metal layer 13, the equivalent board thickness t3 of the heat sink 15A is t3=1.9 mm.

In a case of combination of these, the ratio at 25° C. is (A1×t1×σ1×α1)/{(A2×t2×σ2×α2)+(A3×t3×σ3×α3)}=1.18.

The power module 201 is manufactured by installing the elements 91 complying with required functions on the heat sink-attached power module substrate board 101 composed as above described.

The elements 91 are electric parts having semiconductors, selected from various semiconductors such as IGBT (Insulated Gate Bipolar transistor), MOSFET (Metal Oxide Semiconductor Field Effect Transistor), FWD (Free Wheeling Diode), and the like.

In this case, although illustration is omitted, the elements 91 are provided with an upper electrode part at the upper part and lower electrode part at the lower part, and mounted on the upper surface of the circuit layer 12 (the second layers 122) by joining the lower electrode part on the upper surface of the circuit layer 12 by soldering or the like. The upper electrode parts of the elements 91 are connected to circuit electrode parts or the like of the circuit layer 12 by lead frames 92 and the like joined by soldering and the like.

The elements 91 and the heat sink-attached power module substrate board 101 are integrated by resin sealing by the molding resin 93 excepting the back surface side of the metal layer 13 in the power module 201 on which the elements 91 are mounted. For the molding resin 93, epoxy-type resin including $SiO_2$ filler and the like can be used for example; and it is formed by transfer molding for example.

Next, a method of manufacturing the heat sink-attached power module substrate board 101 composed as above described will be explained. The heat sink-attached power module substrate board 101 is manufactured by joining the ceramic substrate board 11, the first layers 121 of the circuit layer 12, and the metal layer 13 (a first bonding step), and then joining the second layers 122 on the surface of the first layers 121, joining the heat radiation-side bonding material 14 on the surface of the metal layer 13, and further joining the heat sink 15A on the surface of the heat radiation-side bonding material 14 (a second bonding step).

[First Bonding Step]

Figure 3A:
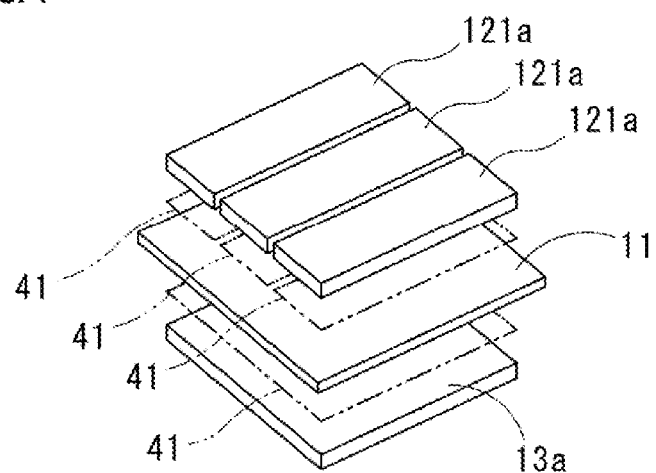
FIG. 3A is a perspective view showing a first bonding step in a manufacturing process of the heat sink-attached power module substrate board of the first embodiment shown in FIG. 1.

As shown in FIG. 3A, first layer aluminum boards 121a which will be the first layers 121 of the circuit layer 12 are laminated on one surface of the ceramic substrate board 11 with soldering material 41 therebetween; and on the other surface, a metal layer aluminum board 13a which will be the metal layer 13 is laminated with the soldering material 41 therebetween. A laminated body of these is pressed in a laminating direction and heated to bonding temperature under vacuum atmosphere; so that the layers are bonded by the soldering material 41 and a joined body 30 formed integral is obtained.

It is preferable to use foils of soldering material of alloy of Al—Si type or the like for bonding these. In a case in which soldering material including Mg is used, it is possible to solder in non-oxidizing atmosphere, not in vacuum atmosphere. For example, a condition of solder bonding is as follows: a pressurizing forth is 0.1 MPa to 1.0 MPa; heating temperature is 630° C. to 650° C.; and this pressurizing and heating state is maintained for 10 minutes to 50 minutes.

[Second Bonding Step]

Figure 3B:
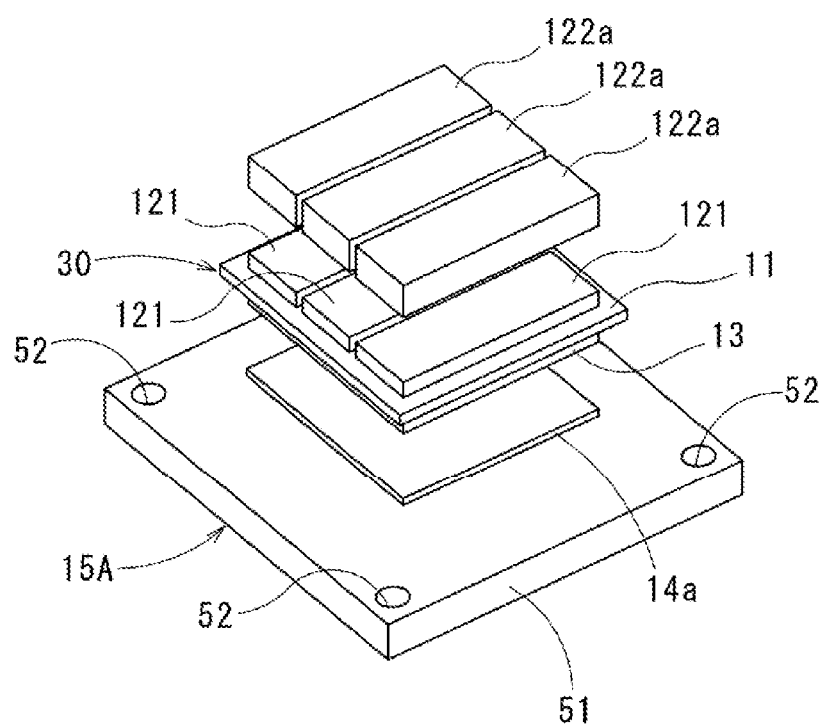
FIG. 3B is a perspective view showing a second bonding step.

As shown in FIG. 3B, second layer copper boards 122a which will be the second layers 122 are laminated on the first layers 121 of the joined body 30 obtained from the first bonding step, and the metal layer 13 is laminated on the heat sink 15A with a bonding board 14a which will be the heat radiation-side bonding material 14 therebetween. The laminated body of these is heated to the bonding temperature in the pressed state under vacuum atmosphere, so that the first layers 121 and the second layers 122, the metal layer 13 and the heat radiation-side bonding material 14, and the heat radiation-side bonding material 14 and the heat sink 15A are joined by the solid phase diffusion respectively.

In this case, for example, the pressurizing and heating state of the pressurizing force 0.5 MPa to 2.0 MPa and the heating temperature 500° C. to 540° C. is maintained for 30 minutes to 120 minutes. Thereby the first layers 121 and the second layers 122, the metal layer 13 and the heat radiation-side bonding material 14, and the heat radiation-side bonding material 14 and the heat sink 15A are joined at the same time: the heat sink-attached power module substrate board 101 shown in FIG. 1 is obtained.

In this embodiment, the respective bonding surfaces between the first layers 121 and the second layers 122, the metal layer 13 and the heat radiation-side bonding material 14, and the heat radiation-side bonding material 14 and the heat sink 15A are flattened and smoothed by removing scratches in advance and then bonded by the solid phase diffusion. Preferable heating temperature of vacuum heating in the solid phase diffusion bonding is a range not less than eutectic temperature of aluminum and copper minus 5° C. and less than the eutectic temperature.

In the heat sink-attached power module substrate board 101 is composed as above described, copper material is used for the second layers 122 of the circuit layer 12, aluminum material is used for the heat sink 15A: the second layers 122 are composed from copper having higher electric conductivity than aluminum. The symmetry structure centering the ceramic substrate board 11 is composed of the aluminum material having low purity aluminum and high rigidity: i.e., the aluminum material having the high yield strength for the heat sink 15A, and in the combination of these, adjusting the ratio $(A1 \times t1 \times \sigma1 \times \alpha1)/\{(A2 \times t2 \times \sigma2 \times \alpha2)+(A3 \times t3 \times \sigma3 \times \alpha3)\}$ into the range not less than 0.70 and not more than 1.30 at 25° C. (room temperature).

As described above, in this embodiment, the rigidity of the members composing the heat sink-attached power module substrate board 101 is evaluated from not only the yield strength, but the relational expression (the ratio) considering the equivalent board thickness which is the volume of the members divided by the bonding area and the linear expansion coefficient of the members. Therefore, as the heat sink-attached power module substrate board 101, even in a structure in which the plurality of small-circuit layers 21 to 23 are aligned so as to pattern the circuit layer 12, it is easy to compose the symmetry structure centering the ceramic substrate board 11, and it is possible to prevent the warp resulting from heating.

In the heat sink-attached power module substrate board 101, since aluminum board that is disposed for the first layers 121 and the metal layer 13 which are joined to the ceramic substrate board 11 has purity not less than 99.99% by mass and relatively soft, i.e., has low yield strength; the breakages can be prevented by reducing thermal stress in the ceramic substrate board 11 resulting from heating the heat sink-attached power module substrate board 101 and the like.

Accordingly, the inner stress at both the surfaces of the ceramic substrate board 11 resulting from heating the heat sink-attached power module substrate board 101 and the like is not biased, and the warp can be prevented in the mounting process of the elements 91 and the usage environment. As a result, the bonding reliability of the power module 201 is improved and good heat radiation property can be performed.

Moreover, in the heat sink-attached power module substrate board 101 of the present embodiment, since the top surface part 51 having the larger area than the bonding surface to the heat radiation-side bonding material 14 is formed on the heat sink 15A, the bonding area to the molding resin 93 can be broadly provided when sealing the power module 201 on which the elements 91 are mounted by the molding resin 93 and the like. Accordingly, the bonding reliability of the elements 91 and the heat sink-attached power module substrate board 101 can be improved.

Second Embodiment

Figure 5:
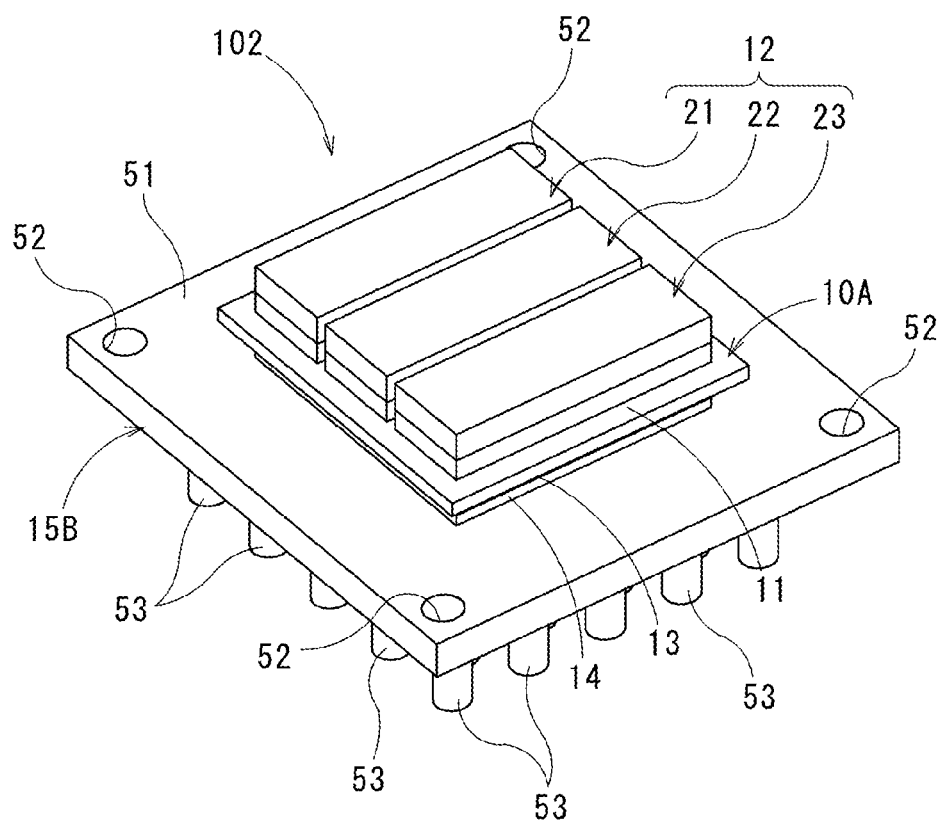
FIG. 5 It is a perspective view of a heat sink-attached power module substrate board of a second embodiment of the present invention.
Figure 6:
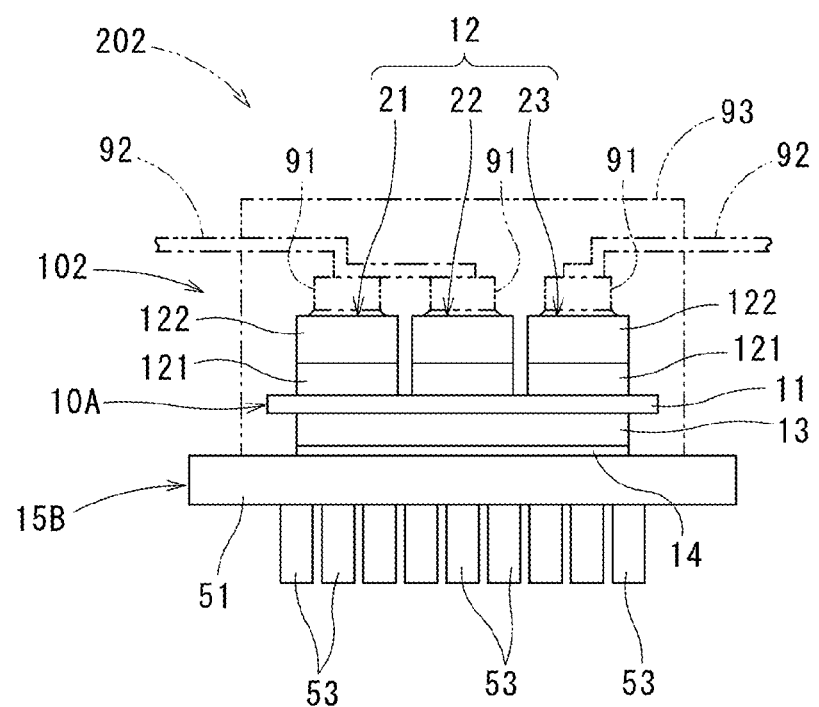
FIG. 6 It is a front view of the heat sink-attached power module substrate board shown in FIG. 5.

In the above-mentioned first embodiment, the heat sink 15A is composed from the flat board-like top surface part 51: however, the present invention includes a structure as a heat sink-attached power module substrate board 102 (a power module 202) of a second embodiment shown in FIG. 5 and FIG. 6, provided with a heat sink 15B in which a plurality of pin fins 53 are disposed. An explanation of the second embodiment is simplified by denoting the same components as in the first embodiment by the same references.

In the heat sink-attached power module substrate board 102 and the power module 202 of the second embodiment, although the structure of the power module substrate board 10A and the heat radiation-side bonding material 14 is the same as in the first embodiment, the heat sink 15B has a form in which the pin fins 53 stands on the lower surface of the top surface part 51 as shown in FIG. 5 and FIG. 6.

Since the heat sink 15B has the plurality of pin fins 53, the whole volume V3 is a value including the top surface part 51 and the pin fins 53; the equivalent board thickness t3 of the heat sink 15B is obtained from the volume V3.

The heat sink-attached power module substrate board 102 composed as above is adjusted to have a relation in which the ratio $(A1 \times t1 \times \sigma1 \times \alpha1)/\{(A2 \times t2 \times \sigma2 \times \alpha2)+(A3 \times t3 \times \sigma3 \times \alpha3)\}$ at 25° C. (room temperature) is not less than 0.70 and not more than 1.30.

By adjusting the ratio $(A1 \times t1 \times \sigma1 \times \alpha1)/\{(A2 \times t2 \times \sigma2 \times \alpha2)+(A3 \times t3 \times \sigma3 \times \alpha3)\}$ into the above range, it is possible to compose the symmetry structure centering the ceramic substrate board 11 and prevent the warp resulting from heating also in the heat sink-attached to power module substrate board 102.

Third Embodiment

Figure 7:
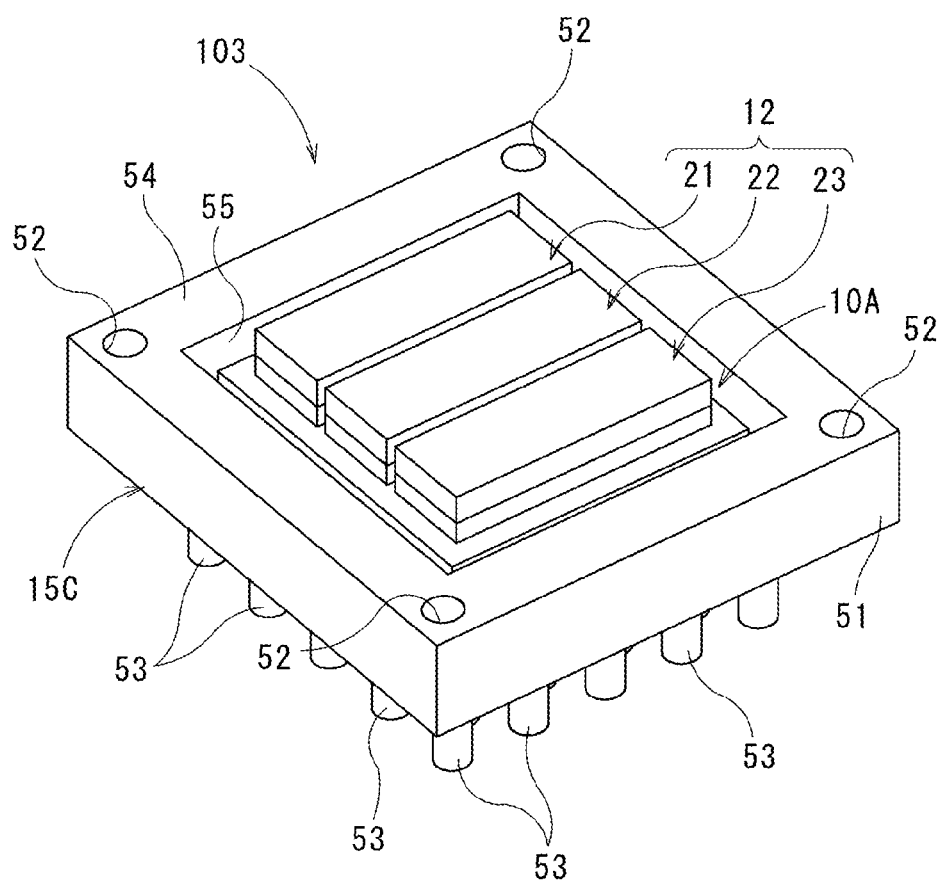
FIG. 7 It is a perspective view of a heat sink-attached power module substrate board of a third embodiment of the present invention.
Figure 8:
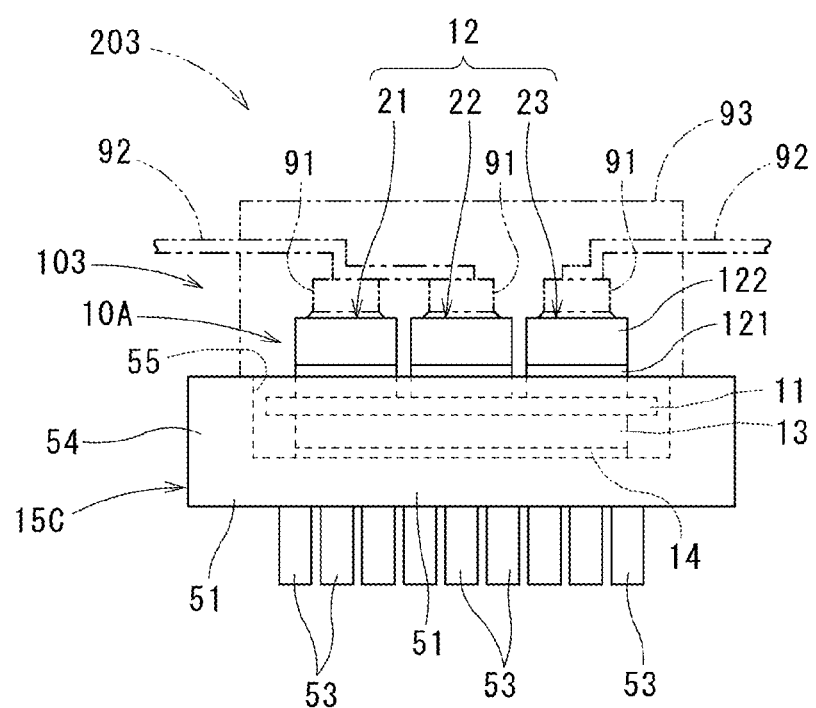
FIG. 8 It is a front view of the heat sink-attached power module substrate board shown in FIG. 7.

FIG. 7 and FIG. 8 shows a heat sink-attached power module substrate board 103 (a power module 203) of a third embodiment. The same elements as in the first embodiment and the second embodiment are denoted by the same reference symbols and explanations are omitted also in this third embodiment.

In the heat sink-attached power module substrate board 103 and the power module 203 of the third embodiment, although the structure of the power module substrate board 10A and the heat radiation-side bonding material 14 is the same as the first embodiment, as shown in FIG. 8, a heat sink 15C has a peripheral wall part 54 standing toward the circuit layer 12 from a periphery of the top surface part 51, and a storing concave part 55 is provided on a top surface of the heat sink 15C to be surrounded by the top surface part 51 and the peripheral wall part 54.

By bonding a bottom surface of this storing concave part 55 and the heat radiation-side bonding material 14 by solid phase diffusion, the power module substrate board 10A and the heat sink 15C are joined with the heat radiation-side bonding material 14 therebetween. At least a part of the heat radiation-side bonding material 14 is stored in the storing concave part 55 of the heat sink 15C. In this embodiment, the heat radiation-side bonding material 14, the metal layer 13 and the ceramic substrate board 11, and a part of the first layers 121 are stored inside the storing concave part 55.

As described above, since the heat sink 15C has the peripheral wall part 54, the whole volume V3 is a value including the top surface part 51, the pin fins 53, and the peripheral wall part 54; the equivalent board thickness t3 of the heat sink 15C is obtained from the volume V3.

The heat sink-attached power module substrate board 103 composed as above is adjusted to have the relation in which the ratio $(A1 \times t1 \times \sigma1 \times \alpha1)/\{(A2 \times t2 \times \sigma2 \times \alpha2)+(A3 \times t3 \times \sigma3 \times \alpha3)\}$ at 25° C. (room temperature) is not less than 0.70 and not more than 1.30.

By adjusting the ratio $(A1 \times t1 \times \sigma1 \times \alpha1)/\{(A2 \times t2 \times \sigma2 \times \alpha2)+(A3 \times t3 \times \sigma3 \times \alpha3)\}$ into the above range, it is possible to compose the symmetry structure centering the ceramic substrate board 11 and prevent the warp resulting from heating also in the heat sink-attached power module substrate board 103.

In the heat sink-attached power module substrate board 103, since the storing concave part 55 surrounded by the peripheral wall part 54 is formed in the heat sink 15C, it is possible to provide a larger bonding area to the molding resin 93 when the power module 203 on which the elements 91 are mounted is sealed by the molding resin 93 or the like. Accordingly, it is possible to improve the bonding reliability of the elements 91 and the heat sink-attached power module substrate board 103.

Fourth Embodiment

Figure 9:
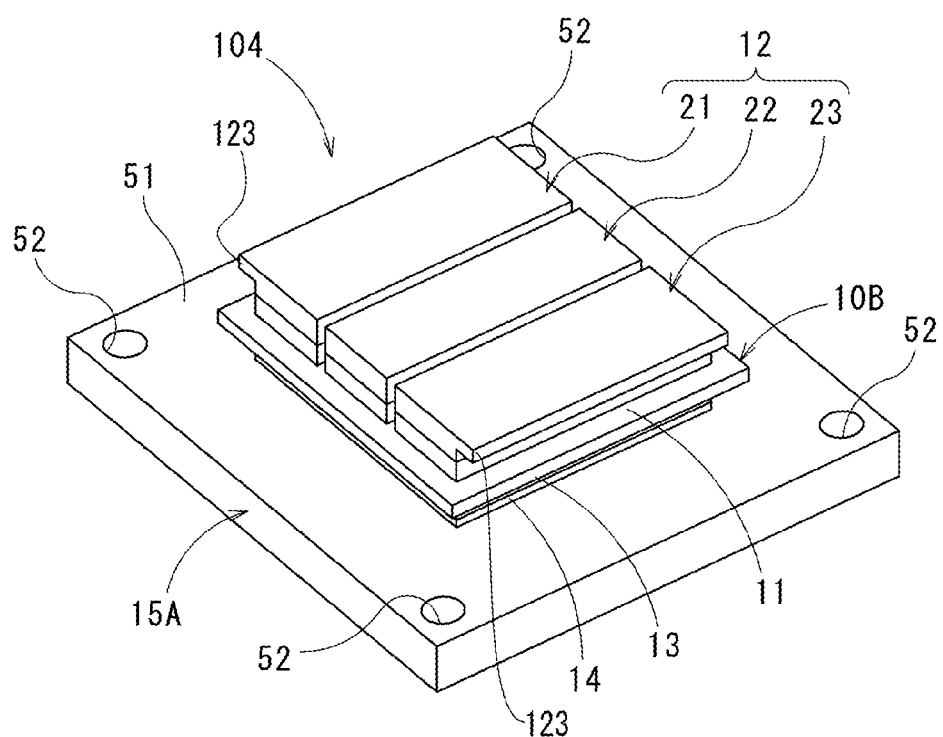
FIG. 9 It is a perspective view of a heat sink-attached power module substrate board of a fourth embodiment of the present invention.
Figure 10:
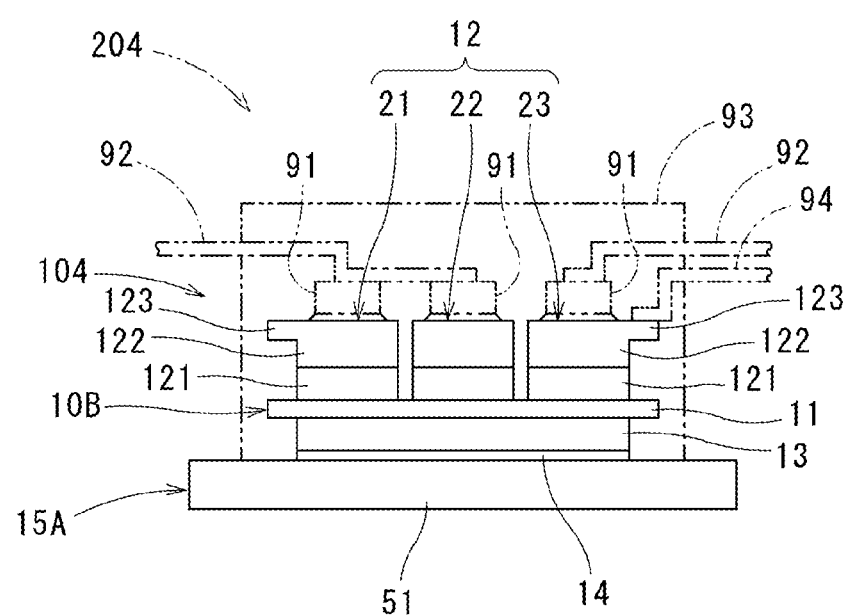
FIG. 10 It is a front view of the heat sink-attached power module substrate shown in FIG. 9.

A heat sink-attached power module substrate board 104 (a power module 204) of a fourth embodiment is shown in FIG. 9 and FIG. 10. The same elements as in the above-mentioned first to third embodiments are denoted by the same reference symbols and explanations are omitted also in this third embodiment.

In the heat sink-attached power module substrate board 104 and the power module 204 of the fourth embodiment, although the structure of the heat radiation-side bonding material 14 and the heat sink 15A is the same as the first embodiment, as shown in FIG. 9 and FIG. 10, terminal parts 123 are formed integrally with the second layers 122 of the circuit layer 12 to project from the first layers 121. To the terminal parts 123, lead frames 94 are connected by solder or the like for external connection.

As described above, since the second layers 122 have the terminal parts 123, the whole volume V1 is a value including the terminal parts 123, and the equivalent board thickness t1 of the second layers 122 is obtained from this volume V1.

The heat sink-attached power module substrate board 104 composed as above is adjusted to have the relation in which the ratio $(A1 \times t1 \times \sigma1 \times \alpha1)/\{(A2 \times t2 \times \sigma2 \times \alpha2)+(A3 \times t3 \times \sigma3 \times \alpha3)\}$ at 25° C. (room temperature) is not less than 0.70 and not more than 1.30.

By adjusting the ratio $(A1 \times t1 \times \sigma1 \times \alpha1)/\{(A2 \times t2 \times \sigma2 \times \alpha2)+(A3 \times t3 \times \sigma3 \times \alpha3)\}$ into the above range, it is possible to compose the symmetry structure centering the ceramic substrate board 11 and prevent the warp resulting from heating also in the heat sink-attached power module substrate board 104.

As described above, the heat sink-attached power module substrate board 104 composed of the circuit layer 12 and the heat sink 15A with the various forms is also evaluated not only by the rigidity of the members but by the relational expression including the equivalent board thickness which is the volume of the members divided by the bonding area and the linear expansion coefficient of the members, so it is possible to compose the symmetry structure centering the ceramic substrate board 11 and prevent the warp resulting from heating.

The present invention is not limited to the above-described embodiments and various modifications may be made without departing from the scope of the present invention.

EXAMPLES

Next, effects of the present invention will be explained in details by Examples, but the present invention is not limited to the following Examples.

The ceramic substrate board made of MN with a board thickness 0.635 mm and the first layer and the metal layer made of 4N—Al with a board thickness 0.6 mm were prepared as members composing samples of Invention Examples 1 to 10 and Comparative Examples 1 to 3. Tables 1 to 3 show the material, the equivalent board thickness, the bonding area, the linear expansion coefficient (CTE), and the yield strength, regarding the second layer of the circuit layer, the heat radiation-side bonding material, and the heat sink.

In Tables 1 and 2, "EMBODIMENT" denotes that the second layer and the heat sink of the respective samples were formed into forms (the shapes) of which of the embodiments. "RATIO" in Table 4 denotes the ratio $(A1 \times t1 \times \sigma1 \times \alpha1)/\{(A2 \times t2 \times \sigma2 \times \alpha2)+(A3 \times t3 \times \sigma3 \times \alpha3)\}$ at 25° C. "YIELD STRENGTH" in Tables 1 to 3 was measured as the yield strength at 25° C. by the method based on JIS Standard G0567:2012.

The samples of the heat sink-attached power module substrate board were made by bonding these according to the manufacturing method described in the first embodiment. Warp amount (initial warp) at normal temperature (25° C.) after bonding and warp amount when heated to 280° C. (heated warp) were measured respectively for the obtained samples.

The warp amount was measured for a change of the flatness at a center part (an area of 40 mm×40 mm) of a back surface of the heat sink by a moiré-type three-dimensional shape measuring device. If a difference between the initial warp and the heating warp was not more than 150 μm, the evaluation was "A" as good for the warp amount is small; or if the difference was more than 150 μm, the evaluation was "B" as bad for the warp amount was large. The results are shown in Table 4.

TABLE 1

| | | | SECOND LAYER OF CIRCUIT LAYER | | | | |
|---|---|---|---|---|---|---|---|
| EXAMPLE | | MATERIAL | EQUIVALENT BOARD THICKNESS t1 mm | BONDING AREA A1 mm² | CTE α1 1/K | YIELD STRENGTH σ1 N/mm² | EMBODIMENT |
| INVENTION EXAMPLE | 1 | C1020 | 2.0 | 1369 | 16.8 | 195 | 2 |
| | 2 | C1020 | 2.0 | 1369 | 16.8 | 195 | 2 |
| | 3 | C1020 | 2.0 | 1184 | 16.8 | 195 | 2 |
| | 4 | C1020 | 1.5 | 1369 | 16.8 | 195 | 3 |
| | 5 | C1020 | 1.5 | 1369 | 16.8 | 195 | 3 |
| | 6 | C1020 | 1.5 | 1369 | 16.8 | 195 | 1 |
| | 7 | C1020 | 1.5 | 1369 | 16.8 | 195 | 1 |
| | 8 | C1020 | 1.5 | 1369 | 16.8 | 195 | 1 |
| | 9 | C1020 | 2.0 | 1369 | 16.8 | 195 | 1 |
| | 10 | C1020 | 1.5 | 1369 | 16.8 | 195 | 1 |
| COMPARATIVE EXAMPLE | 1 | C1020 | 2.0 | 1369 | 16.8 | 195 | 2 |
| | 2 | C1020 | 2.0 | 1369 | 16.8 | 195 | 1 |
| | 3 | C1020 | 2.0 | 1369 | 16.8 | 195 | 1 |

TABLE 2

| | | | HEAT SINK | | | | |
|---|---|---|---|---|---|---|---|
| EXAMPLE | | MATERIAL | EQUIVALENT BOARD THICKNESS t2 mm | BONDING AREA A2 mm² | CTE α2 1/K | YIELD STRENGTH σ2 N/mm² | EMBODIMENT |
| INVENTION EXAMPLE | 1 | A6063 | 3.5 | 1600 | 23.4 | 50 | 2 |
| | 2 | A6063 | 4.0 | 1600 | 23.4 | 50 | 2 |
| | 3 | A6063 | 3.0 | 1600 | 23.4 | 50 | 2 |
| | 4 | A6063 | 3.0 | 1600 | 23.4 | 50 | 3 |
| | 5 | A6063 | 3.5 | 1600 | 23.4 | 50 | 3 |
| | 6 | A6063 | 1.0 | 1600 | 23.4 | 50 | 1 |
| | 7 | A6063 | 0.5 | 1600 | 23.4 | 50 | 1 |
| | 8 | A1050 | 1.0 | 1600 | 23.4 | 30 | 1 |
| | 9 | A1050 | 0.2 | 1600 | 23.4 | 30 | 1 |
| | 10 | A1050 | 0.2 | 1600 | 23.4 | 30 | 1 |
| COMPARATIVE EXAMPLE | 1 | A6063 | 3.5 | 1600 | 23.4 | 50 | 2 |
| | 2 | A6063 | 2.0 | 1600 | 23.4 | 50 | 1 |
| | 3 | A1050 | 0.2 | 1600 | 23.4 | 30 | 1 |

TABLE 3

| | | | HEAT SINK-SIDE BONDING MATERIAL | | | | |
|---|---|---|---|---|---|---|---|
| EXAMPLE | | MATERIAL | EQUIVALENT BOARD THICKNESS t3 mm | BONDING AREA A3 mm² | CTE α3 1/K | YIELD STRENGTH σ3 N/mm² | |
| INVENTION EXAMPLE | 1 | C1020 | 0.1 | 1600 | 16.8 | 195 | |
| | 2 | C1020 | 0.5 | 1600 | 16.8 | 195 | |
| | 3 | C1020 | 0.5 | 1600 | 16.8 | 195 | |
| | 4 | C1020 | 0.1 | 1600 | 16.8 | 195 | |
| | 5 | C1020 | 0.5 | 1600 | 16.8 | 195 | |
| | 6 | C1020 | 1.0 | 1600 | 16.8 | 195 | |
| | 7 | C1020 | 1.5 | 1600 | 16.8 | 195 | |
| | 8 | C1020 | 1.0 | 1600 | 16.8 | 195 | |
| | 9 | C1020 | 1.8 | 1600 | 16.8 | 195 | |
| | 10 | C1020 | 1.0 | 1600 | 16.8 | 195 | |
| COMPARATIVE EXAMPLE | 1 | C1020 | 1.5 | 1600 | 16.8 | 195 | |
| | 2 | C1020 | 0.5 | 1600 | 16.8 | 195 | |
| | 3 | C1020 | 1.0 | 1600 | 16.8 | 195 | |

TABLE 4

| EXAMPLE | | RATIO | EVALUATION |
|---|---|---|---|
| INVENTION EXAMPLE | 1 | 1.27 | A |
| | 2 | 0.89 | A |
| | 3 | 0.94 | A |
| | 4 | 1.10 | A |
| | 5 | 0.73 | A |
| | 6 | 0.95 | A |
| | 7 | 0.76 | A |
| | 8 | 1.06 | A |
| | 9 | 0.93 | A |
| | 10 | 1.23 | A |
| COMPARATIVE EXAMPLE | 1 | 0.62 | B |
| | 2 | 1.41 | B |
| | 3 | 1.64 | B |

As known from Table 4, in Invention Examples 1 to 10 in which the "ratio" is in the range not less than 0.70 and not more than 1.30 at 25° C., the difference between the initial warp and the heating warp were small, so that it was confirmed that the warp resulting from heating was small in the heat sink-attached power module substrate board.

INDUSTRIAL APPLICABILITY

In the heat sink-attached power module substrate board in which the circuit layer and the heat sink are formed of the different material, the warp resulting from heating is reduced and defects in the mounting step of the semiconductor elements are removed, and the warp resulting from the temperature cycles (cold/hot cycles) can be reduced and the bonding reliability is improved.

REFERENCE SIGNS LIST

10A Power module substrate board
11 Ceramic substrate board
12 Circuit layer
13 Metal layer
13a Metal layer aluminum board
14 Heat radiation-side bonding material
14a Bonding board
15A, 15B, 15C Heat sink
21, 22, 23 Small-circuit layer
30 Joined body
51 Top surface part
52 Mounting hole
53 Pin fin
54 Peripheral wall part
55 Storing concave part
91 Element (Semiconductor element)
92, 94 Lead frame
93 Molding resin
101, 102, 103, 104 Heat sink-attached power module substrate board
121 First layer
121a First layer aluminum board
122 Second layer
122a Second layer copper board
123 Terminal part
201, 202, 203, 204 Power module

The invention claimed is:

1. A heat sink-attached power module substrate board comprising
a ceramic substrate board;
a circuit layer joined on a first surface of the ceramic substrate board;
a metal layer joined on a second surface of the ceramic substrate board; and
a heat sink joined on the metal layer with heat radiation-side bonding material therebetween,
in the heat sink-attached power module substrate board,
the circuit layer is a laminated structure having a first layer joined on the first surface of the ceramic substrate board and a second layer joined on a surface of the first layer;
the first layer and the metal layer are made of aluminum with purity of not less than 99.99% by mass,
the second layer and the heat radiation-side bonding material are made of pure copper or copper alloy,
the heat sink is made of aluminum of lower purity than the first layer and the metal layer,
where A1 (mm$^2$) is a bonding area of the second layer and the first layer; t1 (mm) is an equivalent board thickness dividing a volume of the second layer by the bonding area A1; σ1 (N/mm$^2$) is an yield strength of the second layer; and α1 (/K) is a linear expansion coefficient of the second layer;
where A2 (mm$^2$) is a bonding area of the heat radiation-side bonding material and the metal layer; t2 (mm) is an equivalent board thickness dividing a volume of the heat radiation-side bonding material by the bonding area A2; σ2 (N/mm$^2$) is an yield strength of the heat radiation-side bonding material; and α2 (/K) is a linear expansion coefficient of the heat radiation-side bonding material, and
where A3 (mm$^2$) is a bonding area of the heat sink and the heat radiation-side bonding material; t3 (mm) is an equivalent board thickness dividing a volume of the heat sink by the bonding area A3; σ3 (N/mm$^2$) is an yield strength of the heat sink; and α3 (/K) is a linear expansion coefficient of the heat sink,
a ratio $(A1 \times t1 \times \sigma1 \times \alpha1)/\{(A2 \times t2 \times \sigma2 \times \alpha2)+(A3 \times t3 \times \sigma3 \times \alpha3)\}$ at 25° C. is not less than 0.70 and not more than 1.30.

2. The heat sink-attached power module substrate board according to claim 1, wherein an area of a top surface part of the heat sink on which the heat radiation-side bonding material is bonded is larger than an area of a bonded surface with the heat radiation-side bonding material.

3. The heat sink-attached power module substrate board according to claim 2, wherein the heat sink has a peripheral wall part standing at periphery of the top surface part toward the circuit layer and at least a part of the heat radiation-side bonding material is settled in a storing concave part surrounded by the top surface part and the peripheral wall part.

4. A power module comprising the heat sink-attached power module substrate board according to claim 1 and a semiconductor element mounted on a surface of the circuit layer.

5. A power module comprising the heat sink-attached power module substrate board according to claim 2 and a semiconductor element mounted on a surface of the circuit layer.

6. A power module comprising the heat sink-attached power module substrate board according to claim 3 and a semiconductor element mounted on a surface of the circuit layer.

* * * * *